United States Patent [19]
Holst

[11] Patent Number: 6,157,584
[45] Date of Patent: Dec. 5, 2000

[54] REDUNDANCY CIRCUIT AND METHOD FOR SEMICONDUCTOR MEMORY

[75] Inventor: John Christian Holst, San Jose, Calif.

[73] Assignee: Advanced Micro Devices, Inc., Sunnyvale, Calif.

[21] Appl. No.: 09/315,458

[22] Filed: May 20, 1999

[51] Int. Cl.$^7$ .................................................... G11C 7/00
[52] U.S. Cl. .............................. 365/200; 365/51; 365/63; 365/205; 365/230.03
[58] Field of Search .................................... 365/200, 205, 365/230.03, 189.01, 230.01, 51, 63

[56] References Cited

U.S. PATENT DOCUMENTS

| | | | |
|---|---|---|---|
| 5,495,445 | 2/1996 | Proebsting | 365/200 |
| 5,497,347 | 3/1996 | Feng | 365/189.07 |
| 5,572,471 | 11/1996 | Proebsting | 365/200 |

OTHER PUBLICATIONS

SMD–K6®–III Processor Data Sheet, 21918A/0–Feb. 1999, Chapter 2, pp. 5–20.

*Primary Examiner*—David Nelms
*Assistant Examiner*—Hoal V. Ho
*Attorney, Agent, or Firm*—Zagorin, O'Brien & Graham, LLP

[57] ABSTRACT

A redundancy configurations is described in which a redundant element is able to overpower a defective element without the need for physical disconnection or logical deselection and in which plural redundant rows (or columns) are provided to replace more than one defective row (or column) in an array or subarray. Redundancy configurations are further described in which a redundant element is able to overpower a defective element without the need for physical disconnection or logical deselection and in which a given redundant row (or column) may replace a defective row (or column) in one of plural subarrays representing distinct sets of rows (or columns).

21 Claims, 4 Drawing Sheets

REDUNDANCY CIRCUIT AND METHOD FOR SEMICONDUCTOR MEMORY

BACKGROUND OF THE INVENTION

1. Field of the Invention

The present invention relates to semiconductor memories, and in particular, to redundancy therein.

2. Description of the Related Art

Semiconductor memories are generally organized in a two-dimensional array, wherein the memory elements are located at the intersection of rows and columns of the array. To access a given memory element, a word-line and bit-line are selected. For this purpose, memory addresses are typically divided into row and column address signals, which are decoded and used to select groups of memory cells for read or write access.

In the manufacture of semiconductor memories, defects are frequently encountered. Such defects typically affect a small number of memory elements in the memory. To prevent rejection of an entire chip due to the presence of a comparatively small number of defective memory elements and to increase manufacturing process yield, typical semiconductor memory designs provide redundant memory elements. Redundant memory elements are used as replacements for elements that, during testing of the memory device, are determined to be defective. Redundancy circuitry typically includes laser programmable fuses or other non-volatile memory elements suitable for storing address configurations corresponding to defective memory elements.

Some redundancy configurations provide row redundancy while others provide column redundancy. In many redundancy configurations, defective rows or columns must be disabled. Typically, to disable a defective row or column, redundancy circuits physically disconnect the defective row or column (e.g., by fusible links) or logically deselect the defective row or column (e.g., based on a defective row/column address stored in non-volatile memory). Unfortunately, both approaches have disadvantages. Physical disconnection typically requires definition of fusible links on array pitch and further requires disconnection (e.g., by laser zapping) of such fusible links without collateral damage to nearby circuits. Logical deselection typically requires disabling of certain decode paths. Unfortunately, the associated gate delays can adversely affect access time.

U.S. Pat. No. 5,495,445 to Proebsting discloses an improved redundancy scheme in which a redundant element is able to override a defective element without the need for physical disconnection or logical deselection. Proebsting's design segments complementary input/output (I/O) lines into a first segment coupled to main memory elements and a second segment coupled to a redundant memory element. Resistive elements couple the first and second segments of the complementary input/output (I/O) lines. Voltage drop across the resistive element allows the redundant memory element to override a defective element. When the redundant memory element is not selected, the resistive element has a negligible impact on delay because parasitic capacitance at redundant memory element coupling points on the second segment is minimal.

Unfortunately, the redundancy scheme disclosed by Proebsting is limited in two ways. First, only a single group of redundant elements, e.g., a single redundant column or a single redundant row, is available to replace defective columns or rows. As a result, in the configurations disclosed, only one defective row or column is replaceable per array or subarray. Furthermore, extension of the redundancy scheme to provide additional, but similarly configured and connected, redundant columns or rows would adversely affect capacitance at the redundant memory element coupling points. Second, in the configurations disclosed, a group of redundant elements, e.g., a redundant column or redundant row, necessarily shares common word-line or column select circuits with the main columns or rows for which it provides redundancy. As a result, in a memory array decomposed into subarrays representing distinct sets of rows or columns, a given redundant column (or row) is necessarily be dedicated to a single subarray. In short, the redundancy scheme disclosed by Proebsting is limited to single redundant column (or row) per array or subarray, and more than one defective column (or row) per array or subarray is not tolerated.

SUMMARY OF THE INVENTION

Redundancy configurations are desired in which a redundant element is able to overpower a defective element without the need for physical disconnection or logical deselection and in which plural redundant rows (or columns) are provided to replace more than one defective row (or column) in an array or subarray. Redundancy configurations are further desired in which a redundant element is able to overpower a defective element without the need for physical disconnection or logical deselection and in which a given redundant row (or column) may replace a defective row (or column) in one of plural subarrays representing distinct sets of rows (or columns).

Accordingly, a redundancy circuit have been developed for semiconductor integrated circuit applications having a memory including plural banks each representing a distinct set of rows and each having local bit-lines coupled to associated first sense amplifiers themselves coupled to drive outputs onto global bit-lines that span the plural banks. In one embodiment in accordance with the present invention, the redundancy circuit includes redundant local bit-lines spanning plural redundant rows and coupled to associated second sense amplifiers. The global bit-lines are coupled to corresponding third sense amplifiers, and the second sense amplifiers are coupled to forward redundant row data into corresponding of the third sense amplifiers such that output of the second sense amplifiers corresponding to a selected one of the redundant rows overpowers a defective row in any of the plural banks.

In another embodiment in accordance with the present invention, a semiconductor integrated circuit includes plural banks organized as rows and columns of memory cells, global bit-lines spanning the plural banks, at least one redundant bank, first sense amplifiers, redundant sense amplifiers, and second sense amplifiers. Each of the banks represents a distinct set of the rows and includes local bit-lines spanning the distinct set of rows. The redundant bank is organized as redundant rows of redundant memory cells and includes redundant local bit-lines spanning the redundant rows. The first sense amplifiers are coupled to sense corresponding of the local bit-lines and drive outputs onto corresponding of the global bit-lines. The redundant sense amplifiers are coupled to sense corresponding of the redundant local bit-lines. The second sense amplifiers are coupled to sense corresponding of the global bit-lines and further coupled to corresponding of the redundant sense amplifiers such that, when selected, any selected one of the redundant rows overpowers a defective signal from any of the distinct sets of the rows of any of the plural submodules.

In yet another embodiment in accordance with the present invention, a redundancy configuration for semiconductor memory includes plural memory elements, redundant memory elements, second-level sense amplifiers and selection circuitry. The plural memory elements each correspond to an intersection of a normal row and a column and are organized into plural banks each representing a distinct subset of the normal rows and each spanned by distinct local bit-lines with corresponding first-level sense amplifiers coupled to global bit lines spanning the plural banks. The redundant memory elements are organized as plural redundant rows spanned by redundant bit-lines with corresponding first-level redundant sense amplifiers. The second-level sense amplifiers are coupled to corresponding of the global bit lines. The selection circuitry is coupled to select, in accordance with a decoded row address, one of the redundant rows, the selected redundant row forwarding data into the second-level sense amplifiers without preemption of a corresponding addressed one of the normal rows. The forwarded data overpowers normal row data and the overpowered normal row resides in any of the plural banks representing a distinct subset of the normal rows.

In still yet another embodiment in accordance with the present invention, a method of providing redundancy includes supplying a second-level sense amplifier circuit, at isolated inputs thereof, with a low-voltage swing differential signal via global bit lines that span plural banks of the semiconductor memory, and forwarding, via a first-level sense amplifier circuit, redundant row data from a selected one of plural redundant rows into internal nodes of the second-level sense amplifier circuit to overpower the normal row data received via the global bit lines.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
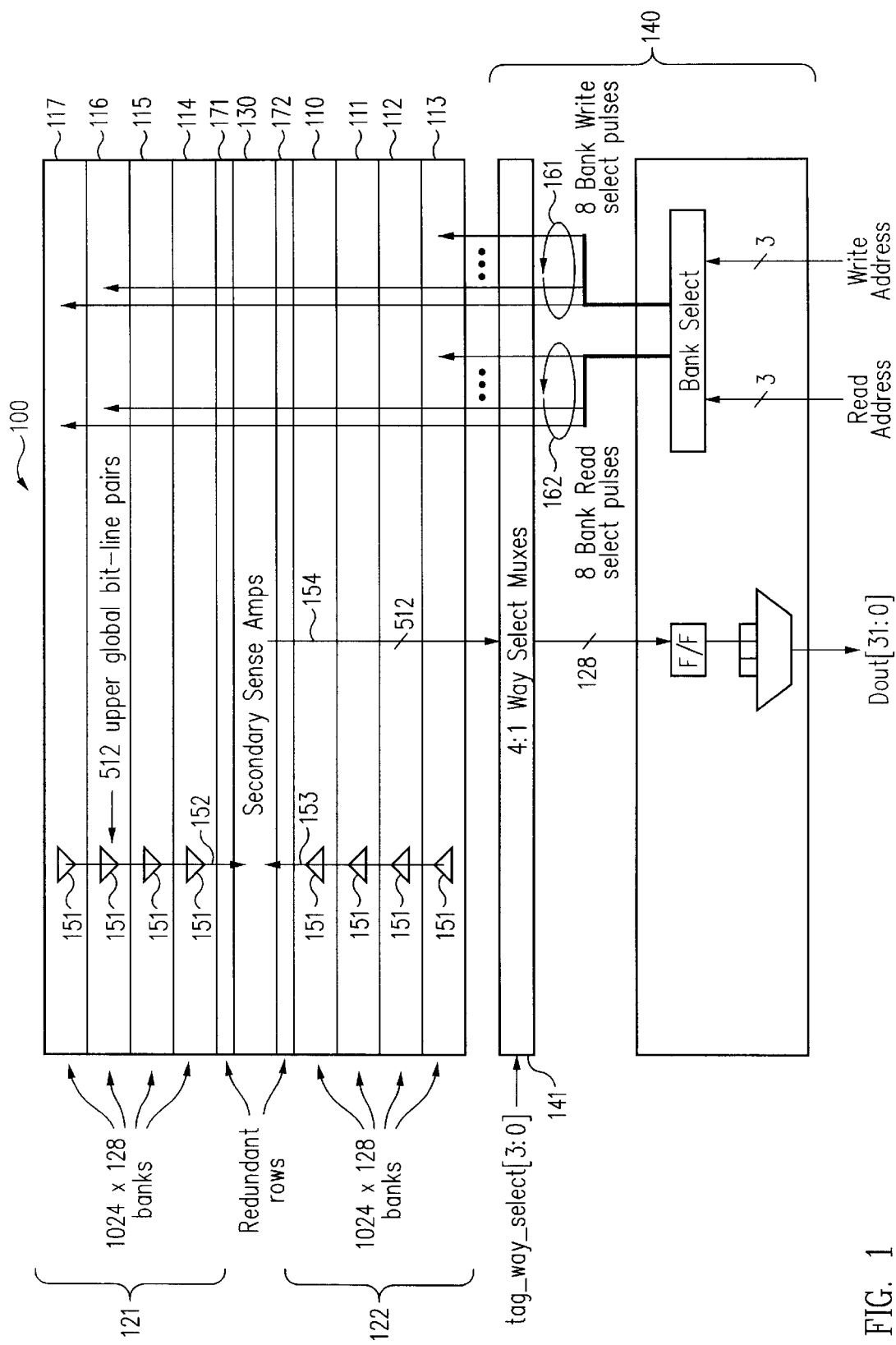
FIG. 1 depicts the layout and illustrative signal paths in an eight (8) submodule memory module including a redundant row configuration in accordance with an exemplary embodiment of the present invention.

FIG. 1 depicts the organization and layout of a memory module 100 in accordance with an exemplary embodiment of the present invention. Eight submodules or banks 110, 111, 112, 113, 114, 115, 116 and 117 are organized into upper and lower groups 121 and 122. In the embodiment of FIG. 1, the submodules are substantially identical and each includes an array of memory cells, word line drivers and word line decoders, column decoders, primary sense amplifiers, write drivers, equilibrate circuits, and control circuitry (not shown). In this regard, the submodules are conventional and, based on the description herein, a variety of suitable configurations will be appreciated by persons of ordinary skill in the art.

Secondary sense amplifiers 130 are positioned toward the center of memory module 100 between upper and lower groups 121 and 122 of submodules. Top-level control, I/O, way-select multiplexers and other logic (shown collectively as logic 140) are positioned toward a periphery of memory module 100. Two sets 171 and 172 of redundant rows of memory cells are located adjacent to secondary sense amplifiers 130. Selection circuitry (not shown) may be programmed to assign a particular redundant row to replace a defective row address. In the configuration of FIG. 1, redundant rows 171 replace defective rows in any of the upper group 121 of submodules, while redundant rows 172 replace defective rows in any of the lower group 122 of submodules.

Redundant row selection is circuitry is conventional, and in general, may be provided using any of a number of suitable techniques, including volatile and non-volatile storage of defective row addresses. In one configuration, the selection circuitry includes a dedicated comparator circuit for each redundant row, which compares its programmed address with the row address of each read and write access to the memory module 100. When a comparator detects a match between the programmed address and a read or write address, the word line of the corresponding redundant row is activated.

In the embodiment of FIG. 1, logic 140 receives read and write addresses and supplies bank select pulses (on lines 162 and 161, respectively) to corresponding submodules of memory module 100 based on the upper address bits of the read or write address (e.g., RA[15:13] or WA[15:13]). Remaining address bits are used for word line select, column select and way select. In the case of read access, word line selection (based on RA[12:6]) and 2:1 column multiplexing (based on RA[5]) are performed at the submodule level, whereas way selection is performed at way select multiplexers 141. As a result, each submodule (e.g., submodule 110, 111, 112, 113, 114, 115, 116 or 117) includes 128 word lines and 1024 columns multiplexed (2:1) onto 512 primary sense amplifiers 151. In the case of write access, write way selection decode occurs within the submodules.

Although other topologies are possible and the above-described read and write topology is merely exemplary, the description that follows is based on the exemplary topology for specificity of description. Nonetheless, embodiments in accordance with the present invention are not limited to the exemplary topology. Based on the description herein, persons of ordinary skill in the art will appreciate a wide variety of suitable topologies that may fall within the scope of claims that follow.

Referring again to FIG. 1, local bit-line pairs (not shown) span the corresponding submodule and corresponding primary sense amplifiers 151 supply differential signals on global bit-line pairs (e.g., upper global bit-line pairs 152 and lower global bit-line pairs 153). Four corresponding primary sense amplifiers 151 of upper group 121 submodules supply differential signals on each of 512 corresponding upper global bit-line pairs 152. Similarly, four corresponding primary sense amplifiers 151 of lower group 122 submodules supply differential signals on each of 512 corresponding lower global bit-line pairs 153. An upper secondary sense amplifier (not shown) of secondary sense amplifiers 130 is coupled to upper global bit-line pairs 152 and a lower secondary sense amplifier (not shown) of secondary sense amplifiers 130 is coupled to lower global bit-line pairs 152. Outputs of corresponding upper and lower secondary sense amplifiers are driven onto a corresponding one of output signal paths 154.

In some configurations in accordance with the present invention, only one submodule or bank is selected and either upper ones or lower ones of secondary sense amplifiers 130 are strobed by a signal originating in the selected submodule. Therefore, only one of corresponding upper and lower secondary sense amplifiers drives its output onto data lines 154. In other embodiments, selection circuitry may be employed. Way select multiplexers 141 perform read way selection downstream from the secondary sense amplifiers. In implementations in which read way selection signals arrive late in a memory access cycle, this positioning helps to take way selection off a critical timing path. However, other implementations may perform read way selection in other manners, e.g., within the submodules or in conjunction with secondary sense amplifier operation.

For ease of illustration, only single ones of the 512 upper global bit-line pairs 152, lower global bit-line pairs 153 and output signal paths 154 are depicted in FIG. 1. Orientations of sense amplifiers are illustrative of overall direction of signal flows; however, lower level organization of memory module 100 will be better understood in the context of FIG. 2.

In particular, submodules 114 and 117 are laid out tail-to-tail. This orientation provides several advantages. First, the tail-to-tail orientation allows the end memory cells (those farthest from the sense amps) of submodule 114 to act as a lithographic and etch matching environment (often referred to as "dummy cells") for those end cells in submodule 117, and vice versa. In fact, the memory cell for the two submodules appear as one contiguous array of memory cells, with a short break in the metal 2 bit lines separating the two. Second, by abutting the sense amplifier regions of two adjacent submodules, as illustrated for submodules 114 and 115, an area is created between memory arrays of the two submodules that is suitable to receive C4 solder balls. In contrast, the sense amplifier region of a single submodule is so small that use of a C4 solder ball in this region would place the solder sufficiently close to memory cells to create an alpha particle, or soft-error, hazard. By orienting the submodules as illustrated, distance between the solder and memory cells of the arrays is increased.

A third advantage of the illustrated submodule orientations relates to guard cells. Though not essential to redundancy techniques in accordance with the present invention, some embodiments may further employ a novel guard cell technique in the two dimensional arrays of memory cells within one or more submodules or banks, including redundant subarrays 171 and 172. Such guard cell techniques are described in a co-pending patent application entitled, "Use of Functional Memory Cells as Guard Cells in a Semiconductor Memory" Ser. No. 09/315,457 naming Holst as inventor and filed on even date herewith, the entirety of which is hereby incorporated by reference.

Figure 2:
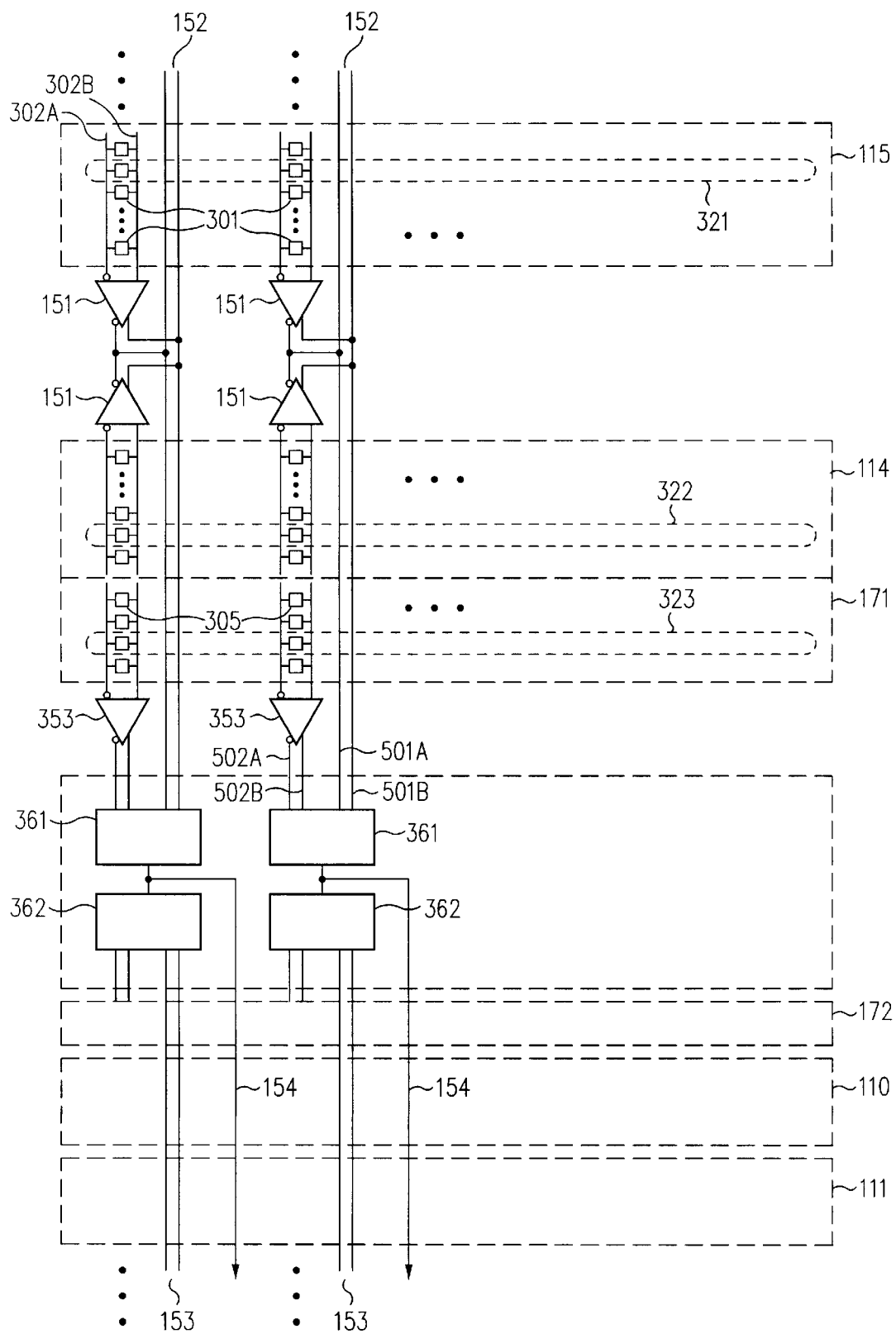
FIG. 2 illustrates a redundancy circuit configuration in accordance with an exemplary embodiment of the present invention.

FIG. 2 illustrates the data path from representative memory cells and representative redundant memory cells toward data line outputs via primary and secondary sense amplifiers. Two submodules 115 and 114 of upper group 121 and corresponding redundant rows 171 are illustrated. Submodules 115 and 114 (as well as those not shown) each include a subarray of memory cells organized as rows and columns. Upon word-line activation, data is sensed by the associated primary sense amplifiers 151 and driven onto global bit-lines 152. Global bit-lines 152 are in turn sensed by secondary sense amplifiers 361 and outputs are driven onto data lines 154.

The four rows of redundant subarray 171 allow memory module 100 to tolerate up to four defective rows (i.e., up to four rows each having at least one defective memory cell). Larger numbers of redundant rows would allow memory module 100 to tolerate larger numbers of defects. As described above, selection circuitry of any of a variety of suitable configurations supplies a redundant word-line activation coincident with presentation of a read or write corresponding to a defective row. For example, when a comparator detects a match between defective address and a read or write address, the word line of a redundant row, e.g., of redundant row 323, is activated. Upon redundant word-line activation, data is sensed by the redundant primary sense amplifiers 353 and driven to secondary sense amplifiers 361. As will be described in greater detail below, the output of redundant primary sense amplifiers 353 overpowers data supplied on global bit-lines 152.

Note that submodules 115 and 114 include distinct sets of rows and that any one of the redundant rows of redundant subarray 171 may be used to overpower any row of any of the upper group 121 submodules (e.g., submodules 114, 115, 116, and 117). For example, although row 321 and row 322 correspond to different row addresses, redundant row 323 may be employed to overpower either one if defective. Furthermore, more than one defective row per submodule may be tolerated using redundant rows of redundant subarray 171. In an exemplary embodiment, submodules (e.g., 114, 115, 116 and 117) each include 128 rows and 1024 columns. To simplify the description, a 2:1 column multiplexing configuration is not shown in FIG. 2. However, multiplexing may be employed if desired. A redundant subarray 171 including 4 rows and 1024 columns allows four defective rows, including four defective rows in one submodule, to be tolerated.

Primary sense amplifiers 151 are input coupled to memory cells (e.g., memory cells 301) via complementary local bit-lines (e.g., local bit-lines 302A and 302B) and output coupled to corresponding ones of secondary sense amplifiers 361 (or 362) via corresponding ones of global bit-lines 152 (or 153). Global bit-lines 152 and global bit-lines 153 are relatively long, capacitive lines long, each spanning four submodules or banks of memory module 100. During a read cycle, primary sense amplifiers 151 of an activated bank drive a low-voltage-swing differential signal onto the corresponding global bit-lines. Suitable designs for primary sense amplifiers 151 are therefore influenced by delay and fanout considerations.

Memory cells of normal rows (e.g., memory cells 301) and of redundant rows (e.g., memory cells 305) are substantially identical. However, other configurations may employ cells of differing designs. Primary sense amplifiers 151 and redundant primary sense amplifiers 353 are of any of a variety of suitable designs. However, in accordance with certain embodiments of the present invention, an advantageous, reduced-area primary sense amplifier configuration is employed. The primary sense amplifier configuration is described in greater detail in a co-pending patent application entitled, "Semiconductor Memory Organization," Ser. No. 09/315,459 naming Holst as inventor and filed on even date herewith, the entirety of which is hereby incorporated by reference.

In the configuration of FIG. 2, redundant primary sense amplifiers 353 and primary sense amplifiers 151 are of differing designs. Primary sense amplifiers 151 for the main memory cells have to sense a small voltage on a heavily loaded bit line (128 cells) and drive a low voltage signal onto a highly capacitive global bit line. In contrast, redundant primary sense amplifiers 353 have a very large bit line signal to sense due to the comparatively small number of cells on the redundant bit line. The redundant bit lines swing full rail when one of the redundant cells is read. Also, redundant primary sense amplifiers 353 need only drive the small capacitive load of forwarding NMOS devices in the secondary sense amplifier. Secondary sense amplifier design is described in greater detail below. Because redundant subarray 171 is positioned adjacent to the secondary sense amplifiers, interconnect parasitic capacitance on redundant primary sense amplifiers 353 outputs is kept low. Redundant primary sense amplifiers 353 can therefore drive full voltage swing signals on their outputs outputs. For the reasons described above, a wide variety of designs, including minimalist configurations not generally suitable for use in typical applications, are suitable for redundant primary sense amplifiers 353. In an illustrative configuration, an inverter is used as a redundant primary sense amplifier.

Figure 3:
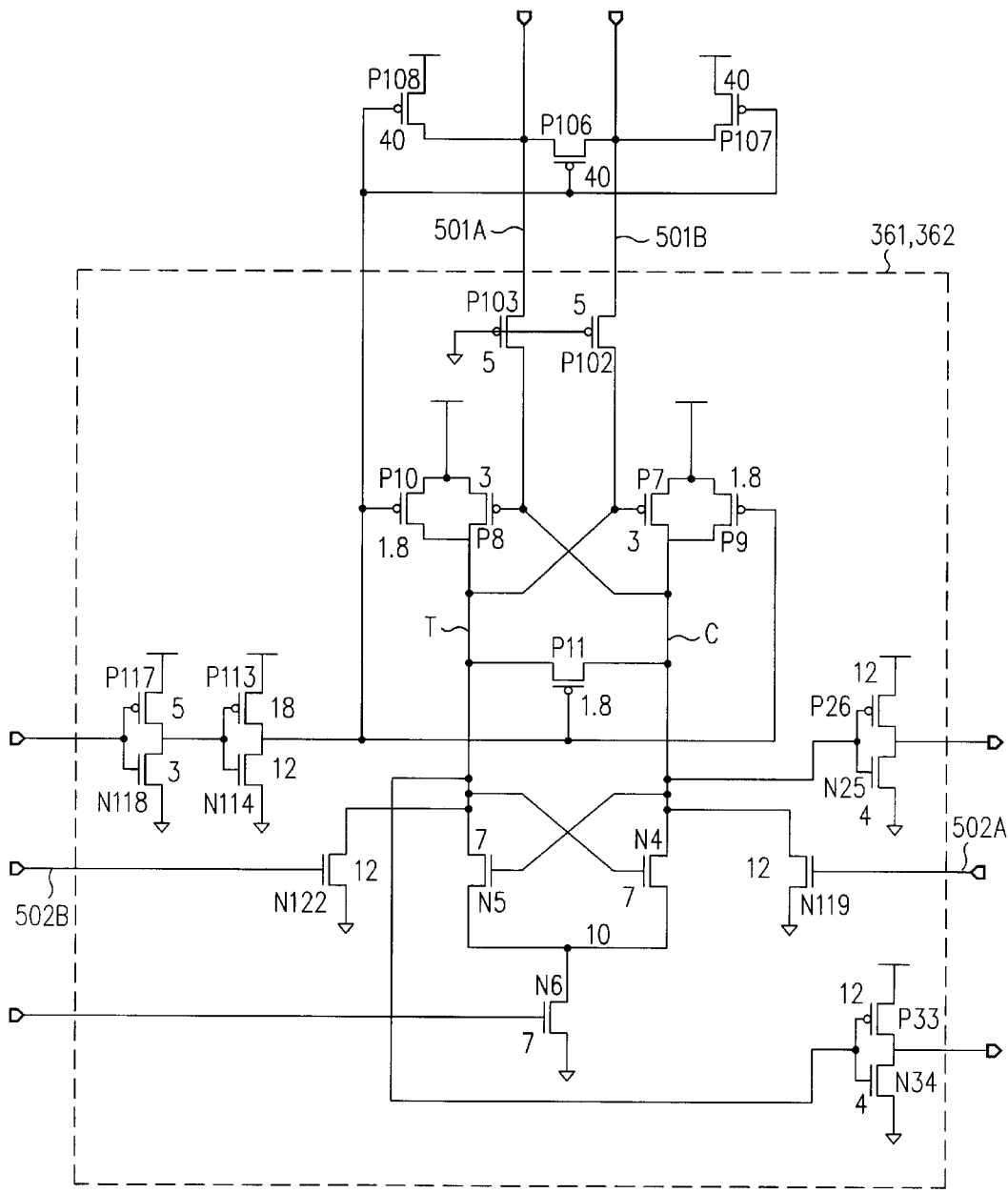
FIG. 3 is a circuit diagram illustrating a secondary sense amplifier configuration in accordance with an exemplary embodiment of the present invention.

Focusing now on a single bit-line, the exemplary secondary sense amplifier configuration of FIG. 3 allows a selected one of the redundant row cells to overpower global bit-line inputs corresponding to a defective, but undisabled, memory cell. Differential global bit line pair inputs 501A and 501B correspond to upper global bit-lines 152 or lower global bit-lines 153. PMOS devices P108, P106, and P107 provide an equilibrate/precharge facility for the corresponding global bit-line pair. PMOS devices P102 and P103 act as isolation resistance. The isolation resistance is important for switching speed of secondary sense amplifier 361, 362 and for forwarding of redundant data (at complementary inputs 502A and 502B) into internal nodes of the secondary sense amplifier, although other designs, such as gate isolated designs, would also be suitable. NMOS devices N119 and N122 provide the path by which redundant data is forwarded into secondary sense amplifier 361, 362. The parasitic load which these devices contribute to nodes T and C is small compared to the total capacitance of these nodes, so the switching speed of these nodes is largely unaffected by the presence of devices N119 and N122. In other respects, secondary sense amplifier 500 is conventional.

Referring back to FIG. 2, each set of redundant rows (e.g., upper set 171 and lower set 172) constitutes a small subarray. Four rows of 1024 redundant cells are included in each set and each set provides row redundancy for group of four submodules or banks representing distinct sets of rows, although other redundancy ratios and allocations are also possible. Upon activation of the word-line for a redundant row (e.g., redundant row 323), data is read out of the redundant array and is supplied on complementary lines 502A and 502B. These complementary outputs are forwarded into the internal nodes (T and C) of secondary sense amplifier 361, 362 as shown in FIG. 3. During a read accesses in which redundant rows are not accessed, inputs supplied on complementary lines 502A and 502B will both remained at $V_{SS}$. However, if a redundant row is read, either line 502A or line 502B will transition to $V_{DD}$. When this occurs, either node T or node C will be pulled low, such that the internal nodes of secondary sense amplifier 361, 362 contain the data from the accessed redundant row. NMOS devices N119 and N122 are large enough to force secondary sense amplifier 361, 362 to this state even if the data on global bit lines 501A and 501B (from an undisabled one of the normal rows) opposes them. This is due to the fact that the global bit lines are isolated by the resistance of PMOS devices P102 and P103. These PMOS isolation devices are not capable of pulling node T or node C to $V_{SS}$, as they suffer a body-affected threshold drop. NMOS devices N119 and N122, on the other hand, are effective at pulling node T or node C to $V_{SS}$. The small parasitic capacitance contributed by NMOS devices N119 and N122 is advantageous given the large voltage swings at nodes T and C, which in some embodiments in accordance with the present invention, may range from $V_{DD}$ to $V_{SS}$. Additionally, the RC delay of the isolation resistance and this parasitic capacitance is low. As a result, speed for read out of the main memory cells is not significantly impacted.

In the embodiment of FIG. 3, the gate width ratio between data forwarding devices (e.g., N119 and N122) and isolation devices (e.g., P102 and P103) is approximately 12:5, although other ratios may be employed consistent with differing load characteristics. In general, there is a tradeoff to be made in the sizing of the data forwarding and isolation devices. Magnitude of the voltage signal on the global bit lines is also a factor. Therefore, the data forwarding device should be large enough to overpower the isolation resistor given a particular level of voltage signal on the global bit-lines. In some embodiments in accordance with the present invention, it may be difficult to limit the voltage excursion on the global bit-lines. In such cases, a larger than minimum signal on the global bit-lines causes the isolation resistors to be able to drive lots of current into the secondary sense amplifiers. As a result, relatively large (e.g., 12 micron) data forwarding devices have been employed. Alternatively, the isolation device can be made smaller (i.e., with higher resistance). Such a configuration tends to slow down the read access of the main memory cells, but makes it easier for the data forwarding devices to overpower the isolation resistance.

Several alternative implementations are also notable. For example, in some implementations, isolation devices are constructed of nwell, poly, or diffusion resistors. In some implementations, a switched gate configuration is employed, wherein the gates of the isolation devices are switched rather than connected to $V_{SS}$ as shown in FIG. 3. In a switched gate implementation, the isolation device is turned off if a redundant row is selected.

Advantageously, and in contrast with prior art configurations, the secondary sense amplifier configuration of FIGS. 2 and 3 allows redundant row data to be forwarded into internal nodes of the sense amplifier. Redundant rows of redundant subarray 171 (and similarly of redundant subarray 172) are not dedicated to any one submodule or bank. Instead, the global bit lines that are overpowered by output from a selected redundant row serve four submodules or banks. For example, when redundant row 323 is selected, defective data on global bit-lines 152 (e.g., from normal row 321) are overpowered by data from a selected redundant row of redundant subarray 171, which is forwarded into the internal nodes of secondary sense amplifiers 361. Since data from any redundant rows of redundant subarray 171 may be forwarded into the secondary sense amplifiers, a selected redundant row can replace any row that reads out data through the corresponding set of global bit lines. This configuration increases the efficiency of the redundancy compared with previous designs, in which redundant memory cells have been dedicated to individual subarrays. If the four redundant rows illustrated were instead distributed, one each, to the four submodules or banks (114, 115, 116 and 117), only one defective row in each of the four banks could be repaired. In contrast, the illustrated configuration allows a defect in each of four rows within one bank to be repaired.

As previously noted, addition of redundant data forwarding devices N119 and N122 to the secondary sense amplifier has a negligible effect on the access time of the data RAM. Furthermore, the redundancy configuration of FIGS. 2 and 3 allows the number of redundant rows to grow without increasing the capacitance of internal nodes T and C of secondary sense amplifiers 361. In general, the redundant rows (e.g., of redundant subarrays 171 and 172) exhibit faster access times than the normal rows. This is because the time required to decode a normal row is longer than the time needed by the redundant row address comparator. As a result, the illustrated redundancy contributes effectively no additional delay to the data RAM access time.

As discussed above with reference to FIG. 3, data can be read from the redundant rows even in the presence of opposing data on the global bit lines. Redundant data forwarding devices N122 and N119 are large enough to overpower isolation devices P102 and P103. Since the data on the global bit lines is overpowered by that read from a redundant row and forwarded into the internal nodes of the secondary sense amplifier, there is no need to preempt the read access to the defective row. Instead, data read from a defective row is simply ignored. Note that, in the configuration of FIGS. 2 and 3, this benefit is achieved by defining the redundant rows in a separate subarray—i.e., one that does not share bit-lines with the normal rows. By defining the redundant rows in a separate subarray with its own primary sense amplifier, the number redundant rows available to repair defects in any submodule or bank can be scaled upward essentially without impact on the capacitance of secondary sense amplifier internal nodes, and therefore essentially without impact on switching speed of the secondary sense amplifiers 361. This insensitivity of internal node capacitance to numbers of redundant rows is particularly important in sense amplifier configurations, such as illustrated in FIG. 3, wherein the internal nodes experience large voltage excursions.

In addition, the fact that accesses to defective rows do not have to be preempted allows the decode path for normal rows to be simplified. Unlike alternative designs, there is no need for the redundancy comparator or other circuits to logically deselect the row decode. This allows for a faster access time and smaller layout area.

Processor, Integrated Circuit and System Embodiments

Figure 4:
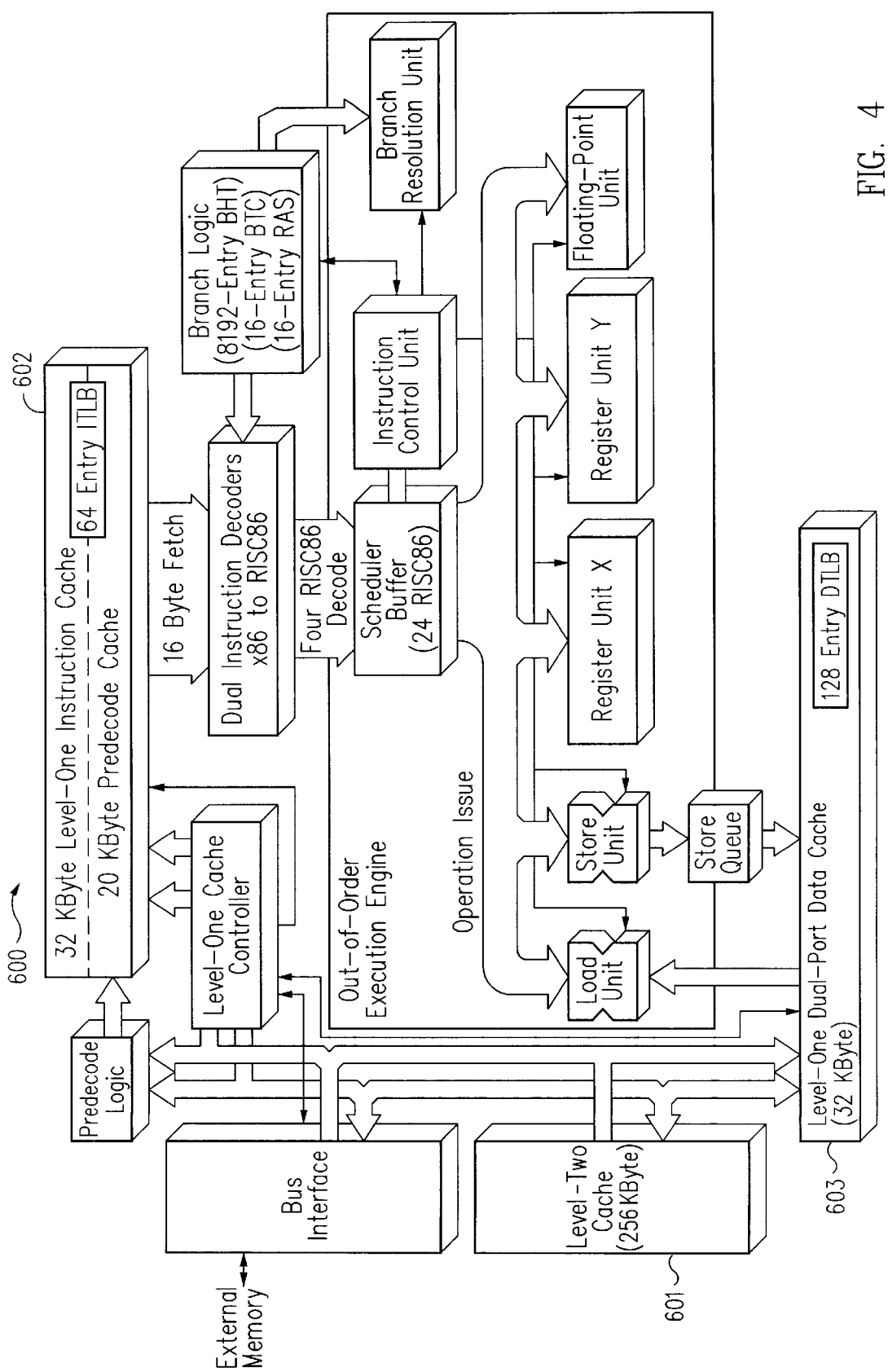
FIG. 4 is a block diagram illustrating an integrated circuit microprocessor architecture including a memory module with redundancy in accordance with an exemplary embodiment of the present invention.

FIG. 4 depicts an exemplary 400 MHz superscalar x86 processor 600 that includes an on-chip backside full-speed 256 KB level-2 (L2) write-back cache with on-chip tags. L2 cache 601 is organized as described above with a row-based redundancy scheme in which a defective rows are overpowered without the need for physical disconnection or logical deselection. In an exemplary configuration, eight redundant rows are provided to replace up to four defective rows in any single submodule or bank. The part includes upper and lower portions and a given redundant row may replace a defective row in any one of the four banks (of a corresponding upper or lower portion) representing distinct sets of rows. Other configurations are possible and, based on the description herein, will be appreciated by persons of ordinary skill in the art.

In an exemplary embodiment, L2 cache 601 is logically organized as a four-way set-associative unified cache with 1K sets and a 64-byte line size. Each line is further divided into two 32-byte blocks. A true least-recently used replacement policy is supported. The LRU information for each set (2 bits per way) is stored in L2 tag RAM. L2 cache 601 uses the MESI protocol to maintain coherency with the level-1 (L1) instruction and data caches (602 and 603) and external memory. Other implementations in accordance with the present invention may build on differing cache organizations and may be configured within differing memory hierarchies.

L2 cache 601 cache runs at a processor clock frequency, and can simultaneously perform one read and one write operation in each clock cycle. To support this functionality, internal portions of the data and tag RAMs run at twice the clock frequency. Compared to an external front-side 100 MHz L2 cache, the on-chip L2 cache provides eight times the bandwidth on a 400 MHz CPU, since it uses separate 64-bit buses for read and write operations. Block read and write latency/throughput for L2 cache 601 is 3/1/1/1. Accesses may be overlapped, such that 64 bits of data can be transferred in each direction between the L1 caches (602 and 603) and L2 cache 601 in each clock cycle.

Physically, L2 cache 601 is split into tag RAM, control and BIST logic, and two instances of a 128 KB data RAM. FIG. 1 illustrates one instance of 128 KB data RAM with some control logic. Other aspects of L2 cache 601 are conventional and suitable implementations will be appreciated by persons of ordinary skill in the art. Each 128 KB data RAM includes eight memory banks, which include 1024 columns by 128 rows of memory cells with associated decode, read and write circuits. For a read access, three read address bits are decoded to activate one of eight bank read select pulses at the rising edge of the clock. A read access is performed in the selected bank while the remaining seven banks remain dormant. Write operations are performed in a similar manner, but are triggered by the falling edge of the clock. Read and write operations may access the same or different banks in the same clock cycle.

In an exemplary configuration, each half of each 32-byte block is stored in a separate instance of data RAM. Because tag way-select signals are generated in parallel with the data RAM reads, each data RAM internally reads four 16-byte half-blocks (one for each way). The 4:1 way selection is performed by static CMOS multiplexers just before data reaches the output registers (see e.g., way select multiplexers 141). A two-level sensing scheme is used in the memory module to reduce power dissipation of the 64-byte read data path by 50% while maintaining high speed. At the submodule- or bank-level, primary sense amplifiers drive reduced voltage-swing signals onto differential global bit lines. Separate sets of global bit lines are used to connect the upper and lower groups of four memory banks, which reduces the global bit line capacitance. Redundant subarrays 171 and 172 are provided for upper and lower group redundancy, respectively. The redundant subarrays also include primary sense amplifiers. These redundant primary sense amplifiers drive signals that are forwarded into corresponding upper or lower secondary sense amplifiers (361 or 362) to override defective data supplied on the corresponding global bit lines (152 or 153).

When not overpowered by redundant row data, upper and lower secondary sense amplifiers (e.g., secondary sense amplifiers 361 and 362) detect the reduced voltage-swing signals on the global bit lines. The secondary sense amplifiers (see FIG. 3) are strobed, regenerative amplifiers that produce a pulse on either a true or complement output when activated. In an illustrative embodiment, the strobe signal for a set of secondary sense amplifiers (e.g., upper secondary sense amplifiers 361 or lower secondary sense amplifiers 362) is derived from the primary sense amplifier strobes of the four memory banks it serves. Since only one set (upper or lower) of secondary sense amplifiers is activated during a read access, the output latch can simply OR together upper and lower sense amplifier outputs.

In one semiconductor integrated circuit realization of the above-described processor including a memory module (L2 cache) configuration in accordance with the present invention, five layers of aluminum are used in addition to a tungsten local interconnect (LI) layer. The use of both LI and Metal 1 facilitates a 9.84 $\mu m^2$ cell size. Local bit-lines, which span 128 memory cells within a submodule or bank, are formed as Metal 2. Polysilicon word-lines are strapped in Metal 3. Global bit-lines (e.g., global bit-lines 152 and global bit-lines 153), which span four submodules or banks, are routed in Metal 4. Metal 4 power supply wires are used to shield the global bit-lines from the write data inputs, which are also routed to each of the banks in Metal 4. Metal 5 runs perpendicular to the Metal 4 shielding wires to complete a power grid and to connect to C4 solder balls. In one semiconductor integrated circuit realization, solder balls are not positioned over the memory cell arrays to prevent alpha particle-included soft errors; however, but solder balls are used over the sense amplifier and word line driver areas of the memory module.

A wide variety of computer system configurations are envisioned, each embodying memory configurations in accordance with present invention as herein described. For example, one such a computer system includes an integrated circuit realization of processor 600 with on- or off-chip instruction, data and/or predecode caches including redundancy circuits configured in accordance with the present invention, a memory subsystem (e.g., RAM), a display adapter, disk controller/adapter, various input/output interfaces and adapters, and corresponding external devices. Memory, adapters and interfaces are conventionally coupled to such integrated circuit microprocessor (e.g., via busses).

While the invention has been described with reference to various embodiments, it will be understood that these embodiments are illustrative and that the scope of the invention is not limited to them. Many variations, modifications, additions, and improvements of the embodiments described are possible. For example, although embodiments have been described with primary and secondary sense amplifiers, the invention is not limited to two-level sensing. Indeed, based on the description herein, persons of ordinary skill in the art will appreciate a wide variety of multi-level sensing configurations if more than two levels of sensing are employed. In this regard, "primary" and "secondary" will be understood to establish a hierarchical relationship between so-called primary and secondary sense amplifiers. Additional sensing circuits may be employed higher or lower in a multi-level sensing hierarchy while still preserving the relationship between "primary" and "secondary" sense amplifiers and without departing from the spirit and scope of the present invention. Furthermore, particular module and array sizes, widths and topologies; column, way and submodule selection techniques; device configurations and process technologies employed are merely illustrative. Based on the descriptions herein, persons of ordinary skill in the art will appreciate a large number of variations and suitable modifications to the illustrated configurations. These and other variations, modifications, additions, and improvements may fall within the scope of the invention as defined in the claims that follow.

What is claimed is:

1. In a semiconductor integrated circuit having a memory including plural banks each representing a distinct set of rows and each having local bit-lines coupled to associated first sense amplifiers themselves coupled to drive outputs onto global bit-lines that span the plural banks, a redundancy circuit comprising:

redundant local bit-lines spanning plural redundant rows and coupled to associated second sense amplifiers;

the global bit-lines coupled to corresponding third sense amplifiers; and the second sense amplifiers coupled to forward redundant row data into corresponding of the third sense amplifiers such that output of the second sense amplifiers corresponding to a selected one of the redundant rows overpowers a defective row in any of the plural banks.

2. The redundancy circuit of claim 1, further comprising:

isolation devices coupled into signal paths from the global bit-lines to internal nodes of corresponding of the third sense amplifiers;

the isolation devices isolating the internal nodes of corresponding of the third sense amplifiers from load associated with corresponding of the global bit-lines and thereby improving switching speed of the sensing circuits; and the isolation devices further providing resistance in signal paths from the global bit-lines to the internal nodes and thereby facilitating the overpowering of the defective row by the output of the second sense amplifiers.

3. The redundancy circuit of claim 2, wherein the isolation devices comprise PMOS devices.

4. The redundancy circuit of claim 2, wherein the second sense amplifiers are coupled to the internal nodes via NMOS devices.

5. The redundancy circuit of claim 2, wherein the isolation devices comprise PMOS devices;

wherein the second sense amplifiers are coupled to the internal nodes via NMOS devices;

wherein, when one of redundant rows is selected, the NMOS devices overwhelm the PMOS devices in affecting the internal nodes, and otherwise contribute essentially insignificant parasitic capacitance compared to total capacitance of the internal nodes.

6. The redundancy circuit of claim 2, wherein the isolation devices comprise switched devices.

7. A semiconductor integrated circuit comprising:

plural banks organized as rows and columns of memory cells, each of the banks representing a distinct set of the rows and including local bit-lines spanning the distinct set of rows;

at least one redundant bank organized as redundant rows of redundant memory cells and including redundant local bit-lines spanning the redundant rows;

global bit-lines spanning the plural banks;

first sense amplifiers coupled to sense corresponding of the local bit-lines and drive outputs onto corresponding of the global bit-lines;

redundant sense amplifiers coupled to sense corresponding of the redundant local bit-lines;

second sense amplifiers coupled to sense corresponding of the global bit-lines and further coupled to corresponding of the redundant sense amplifiers such that, when selected, any selected one of the redundant rows overpowers a defective signal from any of the distinct sets of the rows of any of the plural banks.

8. The semiconductor integrated circuit of claim 7, wherein the second sense amplifiers include:

isolation devices coupled between global bit-line inputs and internal nodes thereof and;

redundant data forwarding devices coupled to forward data from the redundant sense amplifiers into the internal nodes.

9. The semiconductor integrated circuit of claim 7, wherein the redundant memory cells of the redundant rows are substantially identical to the memory cells of the rows.

10. The semiconductor integrated circuit of claim 7, wherein the redundant rows number 4 or more;

wherein the plural banks number 4 or more; and wherein any of the 4 or more redundant rows number are individually selectable to replace any of the rows of the 4 or more banks.

11. The semiconductor integrated circuit of claim 7, wherein the plural banks, the at least one redundant, the global bit-lines, the first sense amplifiers, the redundant sense amplifiers, and the second sense amplifiers comprise an upper half of a memory module; and wherein the semiconductor integrated circuit further comprises a lower halves substantially identical to the upper half.

12. The semiconductor integrated circuit of claim 11, wherein outputs of corresponding upper and lower ones of the secondary sense amplifiers are wire ORed onto an output signal path that spans either the upper or the lower half of the module.

13. The semiconductor integrated circuit of claim 7, wherein signals on the global bit lines are low-voltage-swing differential signals; and wherein outputs of the secondary sense amps include full-voltage-swing signals.

14. The semiconductor integrated circuit of claim 7, wherein outputs of the redundant sense amplifiers are coupled into internal nodes of corresponding of the second sense amplifiers; and wherein the internal nodes exhibit essentially full-voltage swings.

15. The semiconductor integrated circuit of claim 7, further comprising:

a processor core coupled to the access data stored in the plural banks and the at least one redundant bank;

the semiconductor integrated circuit defining an integrated circuit microprocessor with a defect tolerant memory module formed thereon.

16. The semiconductor integrated circuit of claim 15, wherein the defect tolerant memory module comprises an L2 cache.

17. In a semiconductor memory, a method of providing redundancy, the method comprising:

supplying a second-level sense amplifier circuit, at isolated inputs thereof, with a low-voltage swing differential signal via global bit lines that span plural banks of the semiconductor memory;

forwarding, via a first-level sense amplifier circuit, redundant row data from a selected one of plural redundant rows into internal nodes of the second-level sense amplifier circuit to overpower the normal row data received via the global bit lines.

18. The method of claim 17, wherein the isolated inputs of the second-level sense amplifier circuit are separated from the internal nodes thereof by PMOS isolation devices; and wherein the forwarding of redundant row data is further via NMOS devices connected to the internal nodes.

19. The method of claim 17, wherein the forwarding of redundant row data includes driving of an essentially full-voltage swing signal into the internal nodes.

20. The method of claim 17, further comprising:

replacing more than one defective normal row of a single one of the plural banks with corresponding ones of plural redundant rows.

21. The method of claim 17, wherein one of the plural redundant rows is selectable to overpower a defective normal row in any one of the plural banks.

* * * * *